United States Patent [19]
Kobayashi

[11] Patent Number: 5,332,924
[45] Date of Patent: Jul. 26, 1994

[54] SEMICONDUCTOR DEVICE AND PRODUCTION METHOD THEREOF

[75] Inventor: Migaku Kobayashi, Tokyo, Japan

[73] Assignee: NEC Corporation, Tokyo, Japan

[21] Appl. No.: 943,473

[22] Filed: Sep. 11, 1992

[30] Foreign Application Priority Data

Sep. 13, 1991 [JP] Japan .................. 3-262838

[51] Int. Cl.[5] .................. H01L 29/34; H01L 21/465
[52] U.S. Cl. .................. 257/760; 257/758; 257/774; 257/775; 257/638; 257/641; 437/228; 437/235; 437/978
[58] Field of Search .............. 257/758, 760, 774, 775, 257/637, 638, 641; 437/235, 228, 978

[56] References Cited

U.S. PATENT DOCUMENTS 4,451,326  5/1984  Gwozdz .................. 257/760
5,200,808  4/1993  Koyama et al. .................. 257/760

Primary Examiner—Edward Wojciechowicz
Attorney, Agent, or Firm—Burns, Doane, Swecker & Mathis

[57] ABSTRACT

A semiconductor device having a superior step coverage of a layer formed inside or near a contact-hole is provided. An intermediate conductive layer is formed through an insulating layer on a lower conductive layer on a semiconductor substrate, and first, second and third inter-layer insulating layers are formed on the intermediate conductive layer. The third inter-layer insulating layer is selectively removed by an isotropic wet etching method thereby to form a through-hole extended to the second inter-layer insulating layer and having a large opening area. In performing this, the second inter-layer insulating layer acts to restrict the removal of the third inter-layer insulating layer in the thickness direction. Next, the first and second inter-layer insulating layers are selectively removed by an anisotropic dry etching method thereby to form a through-hole having a small opening area. The through-hole having a large opening area and the through-hole having a small opening area form a contact-hole. Subsequently, an upper conductive layer is formed on the third inter-layer insulating layer so as to be electrically connected to the lower conductive layer through the contact-hole.

22 Claims, 4 Drawing Sheets

SEMICONDUCTOR DEVICE AND PRODUCTION METHOD THEREOF

BACKGROUND OF THE INVENTION

Field of the Invention

This invention relates to a semiconductor device and its production method and more particularly, to a semiconductor device in which the step coverage of a film inside or near a through-hole for the wiring use is improved and its production method.

Description of the Related Art

FIG. 1 cross-sectionally shows the structure of a conventional semiconductor device in the vicinity of its contact-hole. In FIG. 1, there are formed functional devices in an active area of a surface of a silicon substrate 301 surrounded by a field insulating film 302. Such functional devices comprise MOS transistors having a gate insulating film 303, gate electrodes 304 and n+ diffusion layers 305 becoming a source or drain region. The surfaces of the field insulating film 302 and the active area are covered with a first silicon oxide film 306, and the surface of the first silicon oxide film 306 is covered with a first BPSG film 307.

On the first BPSG film 307, first conductive films 308 patterned in the desired shape are formed. The surfaces of the first conductive films 308 and the first BPSG film 307 exposed therefrom are covered with a second silicon oxide film 309. Then, the surface of this second silicon oxide film 309 is covered with a second BPSG film 311.

A contact-hole is formed of a hemispherical through-hole 315a having a large opening area and a cylindrical through-hole 315b communicated to the through-hole 315a and extended through the films formed under the second BPSG film 311 to the surface of the n+ diffusion layers 305 between the gate electrodes 304 and having an opening area smaller than that of the through-hole 315a. Within the contact-hole, a second conductive film 313 of an Al-Si alloy, which is patterned in the desired shape, is provided such that the lower end thereof is contacted to the surface of the n+ diffusion layer 305 and the upper end thereof is placed on the second BPSG film 311. Thus, the second conductive film 313 is electrically connected to the n+ diffusion layer 305 without contacting with the first conductive films 308. As shown in FIG. 1, in order to ensure the electrical insulation between the second conductive film 313 and first conductive film 308, the hemispherical through-hole 315a is not extended to the second silicon oxide film 309.

The surfaces of the second conductive film 313 and the second BPSG film 311 exposed therefrom are covered with a passivation film 314.

Next, explanations will be made on a production method of the conventional semiconductor device as shown above.

First, the field insulating film 302 is formed on the surface of the silicon substrate 301 and MOS transistors comprising of the gate insulating film 303, gate electrodes 304 and n+ diffusion layers 305 are formed in the active area provided by forming the field insulating film 302. Thereafter, $SiO_2$ is deposited on the field insulating film 302 and the active area to form the first silicon oxide film 306. Subsequently, BPSG is deposited on the first silicon oxide film 306 by a CVD method and then, flowed by heat-treatment thereby to form the first BPSG film 307.

Next, $WSi_2$ is deposited on the first BPSG film 307 by a sputtering method and then, the $WSi_2$ film thus formed is patterned in the desired shape by the photolithograpy technology thereby to form the first conductive films 308 respectively just over the gate electrodes 304. Subsequently, $SiO_2$ is deposited thereon by the CVD method to form the second silicon oxide film 309 for covering the surfaces of the first BPSG film 307 and first conductive films 308. Then, BPSG is deposited thereon by the CVD method and then, heat-treated to form the second BPSG film 311 for covering the surface of the second silicon oxide film 309.

Next, a photoresist mask is provided on the second BPSG film 311 and then, subjected to the isotropic wet etching technique to selectively remove the second BPSG film 311 thereby to form the hemispherical recess portion 315a therein. Subsequently using the same mask as above, the anisotropic dry etching technique is applied therefor until the surface of the n+ diffusion layer 305 is exposed, thus selectively removing the second BPSG film 311 and the films formed thereunder. As a result, the cylindrical through-hole 315b communicated to the hemispherical recess portion 315a is formed in the second BPSG film 311 and the films formed thereunder. Thus, the contact-hole having a cross-section shown in FIG. 1 and extended from the surface of the second BPSG film 311 to the surface of the n+ diffusion layer 305 is formed.

Subsequently, an Al-Si alloy is deposited on the surface of the second BPSG film 311 and the inside surface of the contact-hole thus formed by the sputtering method. The Al-Si film thus obtained is patterned in the desired shape by photolithography thereby forming the second conductive film 313 shaped as shown in FIG. 1. Thereafter, the CVD method is applied to form the passivation film 314 for covering the surfaces of the second conductive film 313 and second BPSG film 311. Thus, the semiconductor device as shown in FIG. 1 is obtained.

In the conventional semiconductor device as shown in FIG. 1, however, the following problems will arise on the structures of an inter-layer insulating film and contact.

With the conventional semiconductor device, in the process for forming the contact-hole, the second BPSG film 311 is selectively removed by the isotropic wet etching method and then, the second BPSG film 311 and the films formed thereunder are selectively removed by the anisotropic dry etching method. As a result, in order to provide a good step coverage to the second conductive film 313 inside and near the contact-hole, it is required that the hemispherical through hole 315a formed by the isotropic wet etching method is made as large as possible in diameter and the cylindrical through-hole 315b formed by the anisotropic dry etching method is as narrow as possible in depth.

However, the diameter range of the hemispherical through hole 315a formed by the isotropic wet etching method is required to be limited to the range where the electrical insulation between the first and second conductive films 308 and 311 can be maintained, so that if the distance between the first conductive film 308 and the contact-hole is made small to meet the high integration requirement, the diameter of the through-hole 315a cannot be made so large. On the other hand, when considered in view of the circuit operation, it is required that the inter-layer capacity is made as small as possible, which means that the second silicon oxide film 309 and second BPSG film 311 as an inter-layer insulating layer must be made thick. Accordingly, the contact-hole is decreased in diameter and increased in depth, resulting in an increase in aspect ratio of the contact-hole.

As pointed out as above, the conventional semiconductor device makes it difficult to provide a good step coverage to the second conductive film 313 inside and near the contact-hole accompanied with high integration. As a result, when aluminium is used as a material of the second conductive film 313, there will arise such a problem that it is easy to be disconnected inside and/or near the contact-hole due to electromigration or stress migration.

In addition, when the diameter of the through-hole 315a is made small in response to high integration, the passivation film 314 almost cannot be formed on the aluminium film as the second conductive film 313 inside the contact-hole. This results in a reduction in humidity resistance of the semiconductor device.

Thus, an object of this invention is to provide a semiconductor device in which the step coverage of a film inside and near a through-hole for wiring is improved and a production method of the same.

SUMMARY OF THE INVENTION (1) In a first aspect of this invention, a semiconductor device is provided, which comprises a lower conductive layer formed on the surface of or over a semiconductor substrate; a lower insulating layer formed on the lower conductive layer and having a through-hole for wiring; an intermediate conductive layer formed on the lower insulating layer; a first inter-layer insulating layer formed on the intermediate conductive layer and having a through-hole for wiring; a second inter-layer insulating layer formed on the first inter-layer insulating layer and having a through-hole for wiring communicated to the through-hole of the first inter-layer insulating layer; a third inter-layer insulating layer formed on the second inter-layer insulating layer and having a through-hole communicated to and larger in opening area than the through-hole for wiring of the second inter-layer layer insulating layer; and an upper conductive layer formed on the third inter-layer insulating layer and electrically connected through the through-holes of the lower insulating layer and first, second and third insulating layers to the lower conductive layer and not electrically connected to the intermediate conductive layer; wherein the second inter-layer insulating layer has a function to restrict a removal action when the third inter-layer insulating layer is selectively removed to form the through-hole thereof.

A semiconductor device of this invention has the first, second and third inter-layer insulating layers between the intermediate and upper conductive layers, so that when the third inter-layer insulating layer is selectively removed to form a through-hole for wiring having a large opening area, the removal thereof is stopped from being extended to the first inter-layer insulating layer by the second inter-layer insulating layer, resulting in no concern that the first inter-layer insulating layer is removed to expose the surface of the lower conductive layer. As a result, there does not need to remain the third inter-layer insulating layer at a thickness exceeding a predetermined value between the through-hole and lower conductive layer as in the conventional device, resulting in an increase in removing amount of the third inter-layer insulating layer compared with the conventional one. Accordingly, the through-hole can be made large in opening area and depth as compared with the conventional one, thereby making the through-hole for wiring of the lower conductive layer and/or the first inter-layer insulating layer relatively small.

Consequently, according to the semiconductor device of this invention, the step coverage of the upper conductive layer and a passivation layer formed thereon inside and near the wiring through-hole can be improved even when it is to be highly integrated.

In the preferred embodiments of this invention, the thickness of the lower insulating layer is made smaller in the area where the through-hole for wiring is formed than that in the other area thereof. Thus, the step coverage can be further improved than the case that the thickness of the lower insulating layer is not varied.

The lower insulating layer may include an insulating layer having the same removal action restricting function as of the second inter-layer insulating layer.

If is preferable to use a silicon nitride film as the second inter-layer insulating layer. The silicon nitride film has a function to restrict the removal action in selectively removing the second inter-layer insulating layer by an isotropic wet etching method.

As the lower insulating layer and the first and third inter-layer insulating layers, one or a plurality of insulating films generally used (for example, silicon oxide film) are employed, but it is preferable to use a BPSG film as the third inter-layer insulating layer. In addition, as each of the conductive layers, a conductive film formed on the surface of a semiconductor substrate by an impurity diffusing method or the like, or a wiring layer (for example, aluminium film) formed through one or a plurality of insulating layers on the surface of a semiconductor substrate is employed.

(2) In a second aspect of this invention, a production method of the semiconductor device of the first aspect is provided which comprises the steps of forming a lower conductive layer on the surface of or over a semiconductor substrate; forming a lower insulating layer on the lower conductive layer; forming an intermediate conductive layer on the lower insulating layer; forming a first inter-layer insulating layer on the intermediate conductive layer; forming a second inter-layer insulating layer on the first inter-layer insulating layer; forming a third inter-layer insulating layer on the second inter-layer insulating layer; selectively removing the third inter-layer insulating layer thereby forming a through-hole for wiring extended to the second inter-layer insulating layer; selectively removing the second inter-layer insulating layer, first inter-layer insulating layer and lower insulating layer thereby forming a through-hole for wiring which is communicated to the third inter-layer insulating layer and extended to the lower conductive layer as well as has an opening area smaller than that of the through-hole for wiring of the third inter-layer insulating layer; and forming an upper conductive layer on the third inter-layer insulating layer, which is electrically connected through the wiring through-holes of the lower insulating layer and first to third inter-layer insulating layers to the lower conductive layer and not electrically connected to the intermediate conductive layer; wherein the step of forming a through-hole for wiring in the third inter-layer insulating layer restricts a removal action in the layer thickness direction by the second inter-layer insulating layer.

In the preferred embodiment of this invention, the step of forming a through-hole for wiring in the third inter-layer insulating layer is achieved by an isotropic wet etching method and the step of forming a through-hole for wiring in the first and second inter-layer insulating layers and lower insulating layer is achieved by an anisotropic dry etching method. The other steps may be respectively achieved by generally used methods for these purposes.

In another preferred embodiment of this invention, the production method of this invention further comprises a step for partially selectively removing the lower insulating layer in order to reduce the thickness of the lower insulating layer in the vicinity of the position where the wiring through-hole is being formed. In this case, it is preferable that the lower insulating layer comprises an insulating layer having the same removal action restricting function as that of the second inter-layer insulating layer.

(3) In a third aspect of this invention, a semiconductor device having the same effects as these of the semiconductor device of the first aspect is provided, which comprises a lower conductive layer formed on the surface of or over a semiconductor substrate; at least one lower insulating layer formed on the lower conductive layer and having a through-hole for wiring; an intermediate conductive layer formed on the lower insulating layer; a first inter-layer insulating layer and a second inter-layer insulating layer formed on the intermediate conductive layer in this order and having a wiring through-hole communicated to the wiring through-hole of the lower conductive layer and not extended to the first inter-layer insulating layer; and an upper conductive layer formed on the second inter-layer insulating layer, which is electrically connected through the wiring through-holes of the lower insulating layer and inter-layer insulating layers to the lower conductive layer and not electrically connected to the intermediate conductive layer; wherein the thickness of the at least one insulating film where the wiring through-hole is being formed is smaller than that of the same where it is not being formed and yet; the lower insulating layer includes a film having a removal action restricting function in the layer thickness direction when the lower insulating layer is selectively removed.

As in the first aspect, it is preferable that the insulating film having a function to restrict the removal of the lower insulating layer is a silicon nitride film and the second inter-layer insulating layer is a BPSG film. In addition, it is preferable that the wiring through-hole of the second inter-layer insulating layer is substantially hemispherical in shape and the wiring through-hole of the first inter-layer insulating layer and lower insulating layer is substantially cylindrical in shape.

(4) In a fourth aspect of this invention, a production method of the semiconductor device in the third aspect is provided, which comprises the steps of forming a lower conductive layer on the surface of or over a semiconductor substrate; forming at least one lower insulating layer on the lower conductive layer; selectively removing the at least one lower insulating layer thereby to form a layer area whose thickness is small; forming an intermediate conductive layer on the at least one lower insulating layer thus selectively formed the layer area with a small thickness; forming a first inter-layer insulating layer and a second inter-layer insulating layer on the intermediate conductive layer in this order; selectively removing the second inter-layer insulating layer thereby to form a through-hole for wiring not extended to the first inter-layer insulating layer; selectively removing the first inter-layer insulating layer and lower insulating layer thereby to form a through-hole for wiring which is communicated to the wiring through-hole of the second inter-layer insulating layer and extended to the lower conductive layer as well as has an opening area smaller than that of the second inter-layer insulating layer; and forming an upper conductive layer on the second inter-layer insulating layer which is electrically connected through the through-holes of the lower insulating layer and inter-layer insulating layers to the lower conductive layer and not electrically connected to the intermediate conductive layer; wherein the step of forming a layer area with a small thickness in the lower insulating layer utilizes an insulating film which is included in the at least one insulating layer and has a function of restricting the removal of the lower insulating layer thereby to restrict the removal action in the thickness direction of the layer.

With this production method, it is preferable that the step of forming a wiring through-hole in the second inter-layer insulating layer is achieved by an isotropic wet etching method and the step of forming wiring through-holes in the first inter-layer insulating layer and lower insulating layer is achieved by an anisotropic dry etching method. In addition, it is preferable that as the insulating layer for restricting the removal of the lower insulating layer in the thickness direction, a silicon nitride film is employed and as the inter-layer insulating layers, a BPSG film is employed.

DESCRIPTION OF THE PREFERRED EMBODIMENTS

Figure 1:
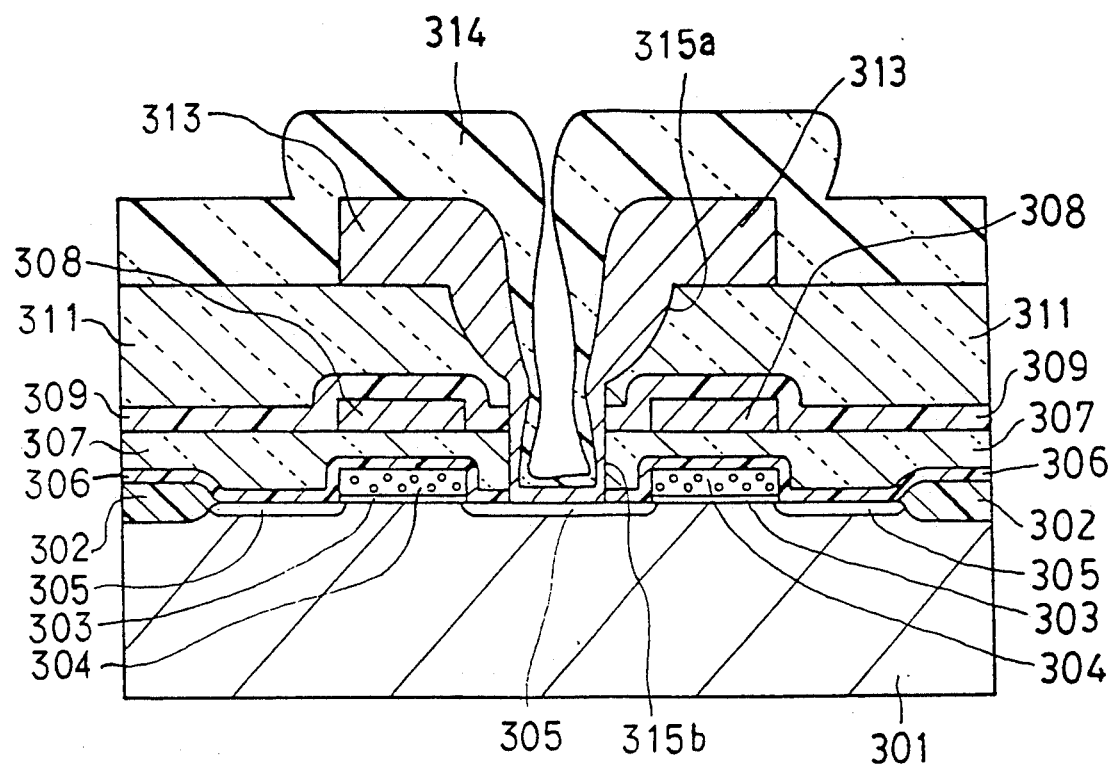
FIG. 1 is a cross-sectional view of a conventional semiconductor device.

Preferred embodiments of this invention will be described below by referring to the drawings attached.

First Embodiment

Figure 2A:
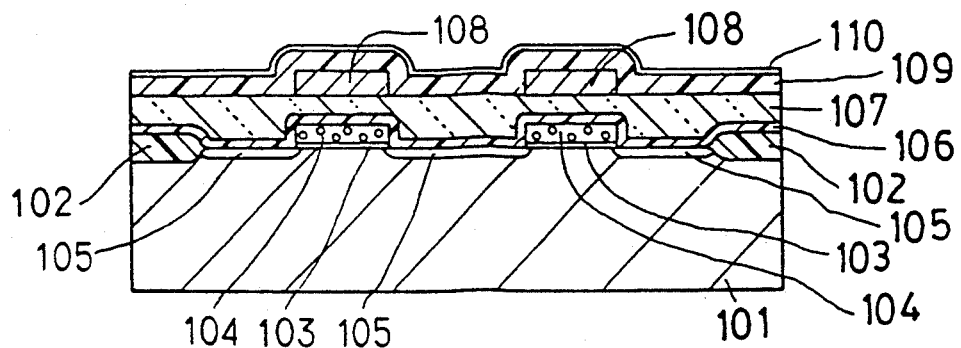
FIGS. 2A to 2C cross-sectionally show a production method of the semiconductor device according to a first embodiment of this invention in the order to be processed.
Figure 2B:
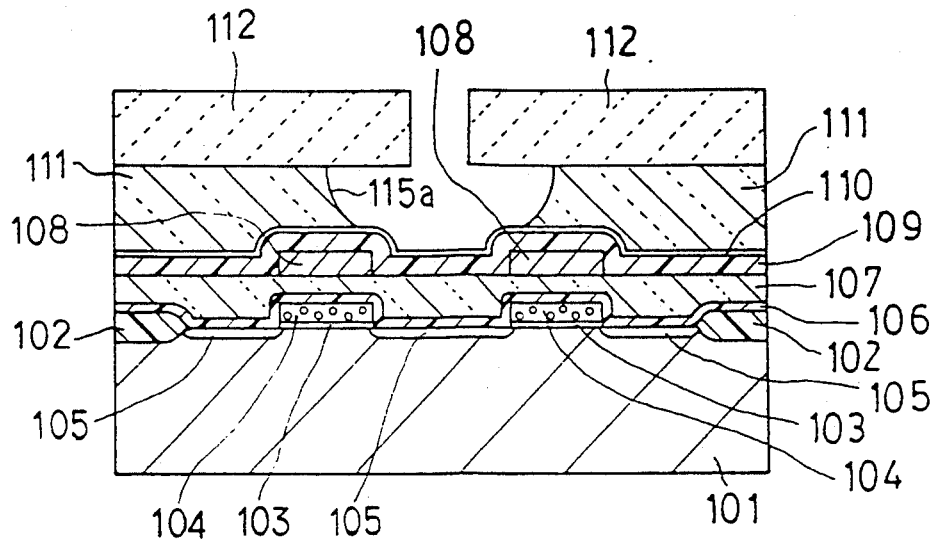
Figure 2C:
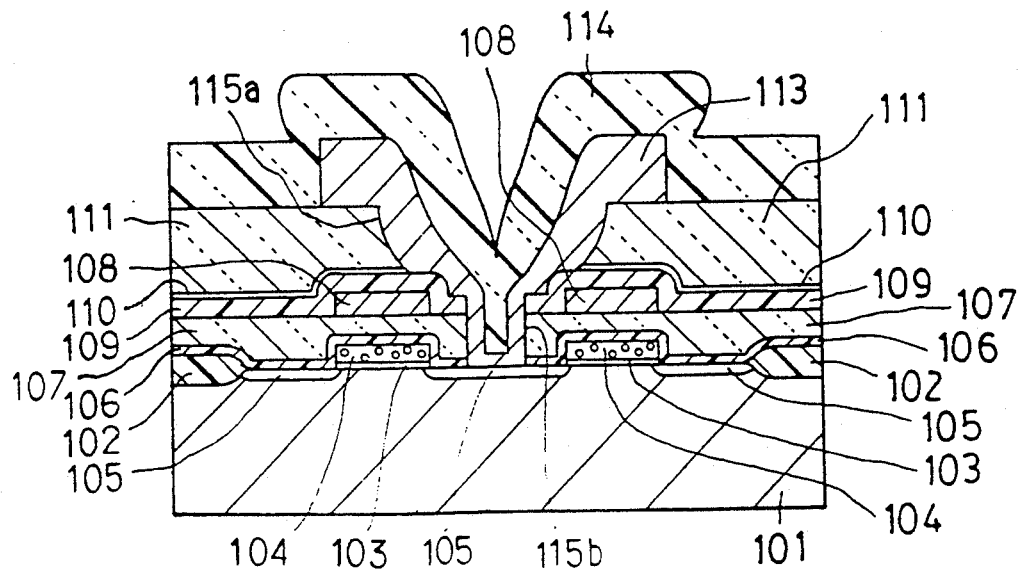

FIG. 2C cross-sectionally shows a structure of a semiconductor device of a first embodiment of this invention in the vicinity of a contact-hole. In FIG. 2C, a silicon substrate 101 has functional elements formed in the active area of the surface thereof surrounded by a field insulating film 102.

In this embodiment, the functional elements are MOS transistors comprising a gate insulating film 103, gate electrodes 104 and n+ diffusion layers 105 becoming a source or drain region. The surfaces of the field insulating film 102 and the active area are covered with a first silicon oxide film 106 the surface of which is, in turn, covered with a first BPSG film 107.

On the surface of the first BPSG film 107, first conductive films 108, which are patterned in the desired shape, are formed so as to be placed respectively just over the gate electrodes 104. The surfaces of the first conductive films 108 and the first BPSG film 107 exposed therefrom are covered with a second silicon oxide film 109 the surface of which is, in turn, covered with a silicon nitride film 110. The surface of the silicon nitride film 110 is covered with a second BPSG film 111.

In the second BPSG film 111, a substantially hemispherical through-hole 115a with a large opening area is formed and in the films formed under the second BPSG film 111, that is, in the silicon nitride film 110, second silicon oxide film 109, first BPSG film 107 and first silicon oxide film 106, a cylindrical through-hole 115b with a smaller opening area than that of the through-hole 115a is formed so as to pass through these films to be extended to the surface of the n+ diffusion layer 105 between the gate electrodes 107 and to be communicated to the through-hole 115a. These through-holes 115a and 115b form a contact-hole. In the contact-hole, a second conductive film 113 of an Al-Si alloy patterned in the desired shape is formed so as to have its lower end contacted to the surface of the n+ diffusion layer 105 and have its upper end placed on the surface of the second conductive film 111. Thus, the second conductive film 113 is electrically connected to the N+ diffusion layers 105 without contacting with the first conductive layers 108.

The surfaces of the second conductive layer 113 and the second BPSG film 111 exposed therefrom are covered with a passivation film 114 of SiON.

The semiconductor device of this embodiment is different from the conventional one already explained above in that the silicon nitride film 110 is formed between the second silicon oxide film 109 and second BPSG film 111 and the shapes of the through-holes 115a and 115b are different therefrom as explained below.

As clear from FIG. 2C, the through-hole 115a with a large opening area is made larger than that of the conventional one shown in FIG. 1. The lower end of the hole 115a is extended to the surface of the second silicon oxide film 109 through a through-hole of the silicon nitride film 110 formed at the corresponding position to the through-hole 115a. The thickness of the second silicon oxide film 109 in the vicinity of such contacting point is substantially equal to that of any other point thereof. On the other hand, the upper end of the through-hole 115b smaller in the opening area is substantially in the same level in height as the surface of the second silicon oxide film 109, which means that it is made lower in height than that of the conventional one shown in FIG. 1. The opening area of the through-hole 115b is equal to that of the conventional one shown in FIG. 1.

With the semiconductor device of this embodiment, the n+ diffusion layers 105 on the surface of the semiconductor substrate 101 are corresponded to a lower conductive layer, the first silicon oxide film 106 and first BPSG film 107 are corresponded to a lower insulating layer, the first conductive films 108 are corresponded to an intermediate conductive layer, the second silicon oxide film 109, silicon nitride film 107, and second BPSG film 111 are corresponded respectively to a first inter-layer insulating film, second inter-layer insulating film and third inter-layer insulating film, and the second conductive film 113 is corresponded to an upper conductive layer.

In the semiconductor device of this embodiment structured as above, the insulation between the first and second conductive films 108 and 113 is surely made by the second silicon oxide film 109. The through-hole 115a constituting the upper part of the contact-hole is larger in diameter (opening area) compared with the depth thereof, and the through-hole 115b constituting the lower part thereof is made smaller in depth compared with the diameter thereof, thus being made small in aspect ratio. As a result, the step coverage of the second conductive film 113 and passivation film 114 can be largely improved.

Next, the production method of the semiconductor device as explained above will be described below while referring to FIGS. 2A to 2C.

As shown in FIG. 2A, first, the field insulating film 102 is formed on the surface of the silicon substrate 101 thereby to obtain the active area. MOS transistors comprising the gate insulating layer 103, gate electrodes 104 and n+ diffusion layers 105 are formed in the active area thus obtained. Then, the first silicon oxide film 106 is formed on the field insulating film 102 and the active area surface by the CVD method. Subsequently, BPSG is deposited on the first silicon oxide film 106 by the CVD method and then, heat-treated to be flowed thereby forming the first BPSG film 107.

Next, WSi$_2$ is deposited on the first BPSG film 107 by the sputtering method to form a WSi$_2$ film. The WSi$_2$ film thus obtained is patterned by photolithography in the desired shape thereby forming the first conductive films 108 so as to be placed respectively just over the gate electrodes 104. Then, SiO$_2$ is deposited thereon by the CVD method to form the second silicon oxide film 109 for covering the surfaces of the first BPSG film 107 and the first conductive films 108. The silicon nitride film 110 is formed thereon by the CVD method, the state of which is shown in FIG. 2A.

The above-explained processes are identical to those of the conventional one shown in FIG. 1 excepting that the method of this embodiment includes the process of forming the silicon nitride film 110.

Next, BPSG is deposited on the silicon oxide film 110 by the CVD method and then, heat-treated thereby forming the second BPSG film 111. Subsequently, a photoresist mask 112 patterned so as to have a hole at a position where the contact-hole is to be formed is provided by photolithography on the second BPSG film 111. Then, with the mask 112, the second BPSG film 111 is selectively etched with an isotropic etching solution, for example, of hydrofluoric acid system thereby to form the hemispherical through-hole 115a. In this case, there exists the silicon nitride film 110 beneath the second BPSG film 111, so that the etching in the thickness (depth) direction thereof is stopped at the position where the silicon nitride film 110 is exposed and thereafter, is progressed only in the surface (horizontal) direction thereof. As a result, in the through-hole 115a, as shown in FIG. 2B, the silicon oxide film 110 is exposed up to the positions substantially just above the first conductive layers 108.

Subsequently, with the same mask 112, the anisotropic dry etching is applied thereto until the surface of the n+ diffusion layer 105 is exposed, thus selectively removing the silicon nitride film 110, second silicon oxide film 109, first BPSG film 107 and first silicon oxide film 106 formed under the second BPSG film 111. Thus, the cylindrical through-hole 115b is formed which is extended from the surface of the silicon nitride film 110 to the surface of the n+ diffusion layer 105. As a result, the contact-hole having a cross-section as shown in FIG. 2C can be formed.

Thereafter, after removing the mask 112, an Al-Si film is formed on the inside surface of the contact-hole and the surface of the second BPSG film 111 by the sputtering method. The Al-Si film is patterned in the desired shape thereby forming the second conductive film 113. By the CVD method, SiOn is deposited thereon to form the passivation film 114 for covering the surfaces of the second conductive film 113 and second BPSG film 111. Consequently, the semiconductor device of this embodiment is obtained as shown in FIG. 2C.

With the production method of this embodiment as explained above, in the isotropic wet etching process of the second BPSG film 111, the silicon nitride film 110 serves to act as a stopper of etching thereby restricting the removal action to be progressed beyond the same in the thickness (depth) direction, so that as shown in FIG. 2B, the through-hole 115a larger in the opening area relatively to the depth can be formed in the second BPSG film 111 and yet, the thickness of the second silicon oxide film 109 is not reduced by etching. The silicon nitride film 110 exposed in the contact-hole can be easily removed by the following anisotropic dry etching process.

As a result, according to the method of this embodiment, the wet etching quantity can be set such as to be enough large independently of the distance between the first conductive film 108 and the contact-hole. Accordingly, the semiconductor device having the step coverage of the second conductive film 113 and passivation film 114 largely improved can be surely obtained.

Second Embodiment

Figure 3A:
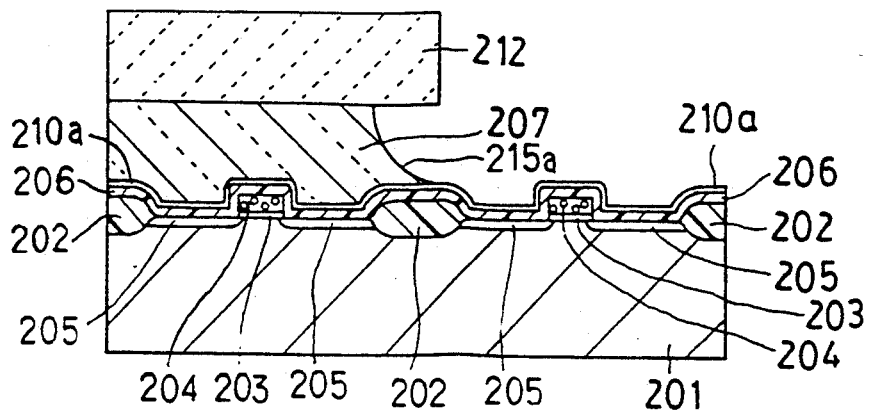
FIGS. 3A to 3C cross-sectionally show a production method of a semiconductor device according to a second embodiment of this invention in the order to be processed.
Figure 3B:
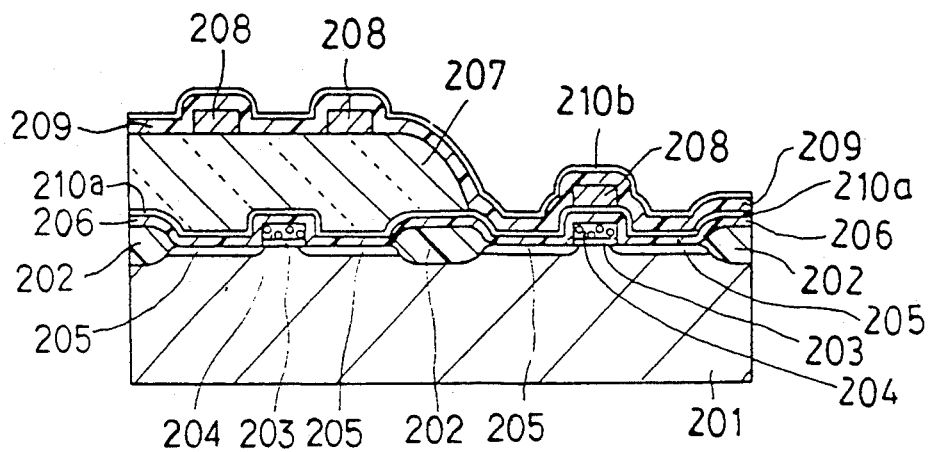
Figure 3C:
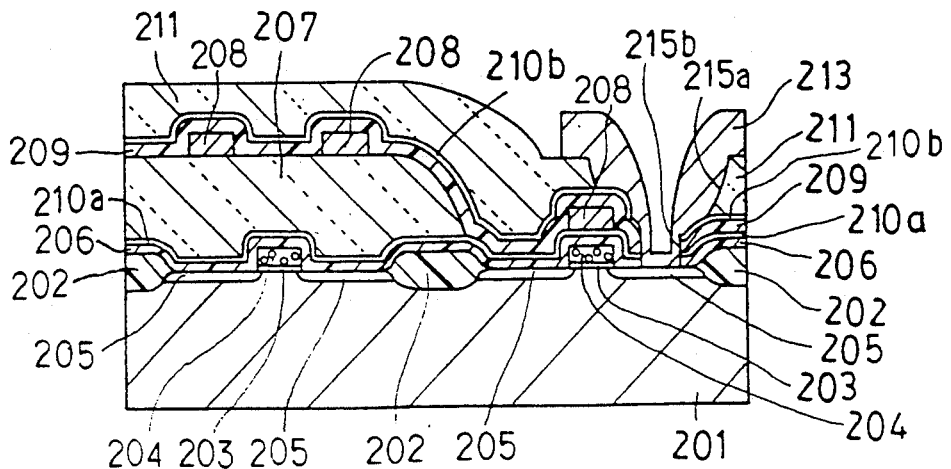

FIG. 3C cross-sectionally shows a semiconductor device according to a second embodiment of this invention, which is adapted to be used when a contact-hole is to be provided at a position where an insulating film between adjacent conductive films is not large in thickness.

In FIG. 3C, a silicon substrate 201 has an active area on the surface thereof surrounded by a field insulating film 102. In the active area thus formed, MOS transistors comprising a gate insulating film 203, gate electrodes 204 and n+ diffusion layers 205 becoming a source region and drain region. The surfaces of the field insulating film 202 and the active area are covered with a first silicon oxide film 206 the surface of which is, in turn, covered with a first silicon nitride film 210a.

The first silicon oxide film 210a has the surface covered with a first BPSG film 207 excepting the area thereof at and near the position where the contact-hole is formed. On the first BPSG film 207 is formed a first conductive films 208 patterned in the desired shape. In the area where the first BPSG film 207 is not formed, the first conductive film 208 is formed directly on the first silicon nitride film 210a. The surfaces of the first conductive film 208 and the first BPSG film 207 exposed therefrom are covered with a second silicon oxide film 209. The second silicon oxide film 209 covers the first silicon nitride film 210a in the area thereof where the first BPSG film 207 is not formed. On the second silicon oxide film 209, a second silicon nitride film 210b and a second BPSG film 211 are formed in this order.

In this embodiment, the contact-hole is formed at a position where the first BPSG film 207 is not formed, but similar to the first embodiment, it is made of a hemispherical through-hole 215a formed in the second BPSG film 211 and a cylindrical through-hole 215b formed extending through the second silicon nitride film 210b, second silicon oxide film 209, first silicon nitride film 210a and first silicon oxide film 206 formed under the second BPSG film 211.

On the surface of the second BPSG film 211 and the inside surface of the contact-hole, a second conductive film 213 of an Al-Si alloy patterned in the desired shape is formed. In FIG. 3C, a passivation film for covering the surfaces of the second BPSG film 211 and second conductive film 213 is not shown.

With the semiconductor device of this second embodiment as shown above, the n+ diffusion layers 205 on the surface of the semiconductor substrate 201 are corresponded to a lower conductive layer, the first silicon oxide film 206, first silicon nitride film 210a and first BPSG film 207 are corresponded to a lower insulating layer, the first conductive layers 208 are corresponded to an intermediate conductive layer, the second silicon oxide film 209, second silicon nitride film 210b and second BPSG film 211 are corresponded respectively to a first inter-layer insulating film, second inter-layer insulating film and third inter-layer insulating film, and the second conductive film 213 is corresponded to an upper conductive layer.

Next, the production method of the semiconductor device of this embodiment as shown above will be described below.

As shown in FIG. 3A, first, on the silicon substrate 201 having the field insulating film 202 and MOS transistors formed thereon, the first silicon oxide film 206 and first silicon nitride film 210a are formed by the CVD method in this order.

Then, BPSG is deposited on the first silicon nitride film 210a by the CVD method and heat-treated thereby forming the first BPSG film 207. Subsequently, a photoresist mask 212 having a hole at a predetermined position is provided thereon by photolithography. Using the mask 212, the first BPSG film 207 is selectively removed with an isotropic etching solution of hydrofluoric acid system. Here, similar to the first embodiment, the first silicon nitride film 210a formed beneath the first BPSG film 207 serves to stop the etching action to be progressed further in the depth direction and as a result, the first BPSG film 207 can be surely removed in the position where the contact-hole is to be formed, which is shown in FIG. 3A.

Next, after removing the mask 212, heat-treatment is subjected to the substrate 201 to reflow the first BPSG film 207. Thereafter, on the surfaces of the first BPSG film 207 and first silicon nitride film 210a, $WSi_2$ is deposited by the sputtering method and then, patterned in the desired shape thereby forming the first conductive films 208. Then, the second silicon oxide film 209 and second silicon nitride film 210b are formed on the surfaces of the first conductive films 208 and first BPSG film 207 exposed therefrom by the CVD method in this order, which is shown in FIG. 3B. Next, the second BPSG film 211 is formed on the second silicon nitride film 210b by the CVD method. Then, similar to the first embodiment, a photoresist mask (not shown) having a hole at a position where the contact-hole is to be formed is provided thereon by photolithography. Then, with the mask thus provided, the second BPSG film 211 is selectively etched with an isotropic etching solution of hydrofluoric acid system, thus forming the hemispherical through-hole 215a. In this case, the etching is stopped to be progressed further in the film thickness direction by the second silicon nitride film 210b, so that the through-hole 215a within which the second silicon nitride film 210b is exposed can be formed.

Subsequently, as in the first embodiment, using the same mask, the anisotropic dry etching is carried out until the surface of the n+ diffusion layer 205 is exposed. Thus, the second silicon nitride film 210b, second silicon oxide film 209, first silicon nitride film 210a and first silicon oxide film 206 formed under the second BPSG film 211 are selectively removed, thus being formed the cylindrical through-hole 215b extended from the surface of the second silicon nitride film 210b to the surface of the n+ diffusion layer 205. Consequently, the contact-hole having the cross-section as shown in FIG. 3C can be formed.

Then, as in the first embodiment, after removing the mask, an Al-Si film is formed on the surface of the second BPSG film 211 and the inside surface of the contact-hole by the sputtering method and then, patterned in the desired shape thereby obtaining the second conductive layer 213. The passivation film (not shown) is formed thereon by the CVD method, thus obtaining the semiconductor device of this second embodiment.

This embodiment features that the first BPSG film 207 is selectively removed at and near the contact-hole and the through-hole 215b formed by the anisotropic dry etching is reduced in depth thereby providing a small aspect ratio.

In general, in such semiconductor devices, the thickness required for the first BPSG film 207 is determined depending on the degree of a step developed on the surface on which the first BPSG film 207 is to be formed by forming the functional elements on the substrate 201 and on the parasitic capacity between adjacent conductive layers having the first BPSG film 207 sandwiched therebetween. Such a case that the thickness of the first BPSG film 207 is uniform over the entire semiconductor chip is limited to a special case and in general, the area where the thickness thereof is required to be large is limited to a specific region. As a result, in this embodiment, the area where the first BPSG film 207 is formed is limited to the specific region and in the area where not necessary to be formed, the first BPSG film 207 is removed thereby to be provided with the least necessary insulating film only.

In this embodiment, in selectively removing the first BPSG film 207, the first silicon nitride film 210a serves to act as an etching stopper and as a result, the thickness of the first silicon oxide film 206 on the gate electrodes 204 can be maintained at a level exceeding a predetermined value. In addition, in selectively removing the second BPSG film 211, the second silicon nitride film 210b serves to act as an etching stopper and as a result, the opening area and depth of the through-hole 215a can be made enough large.

As explained above, the semiconductor device of the second embodiment makes it possible to reduce the aspect ratio of the through-hole 215a, resulting in obtaining a step coverage more improved than in the first embodiment.

Third Embodiment

Figure 4:
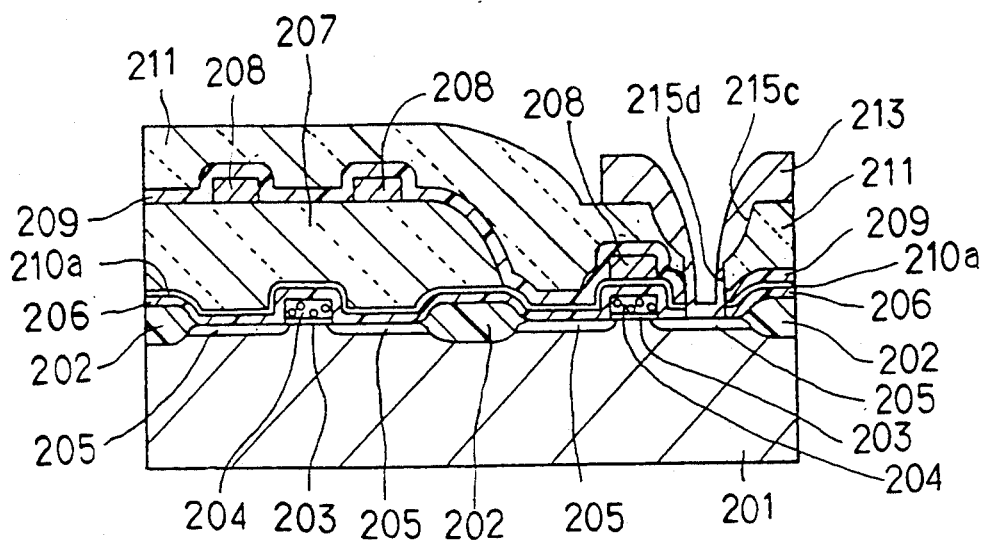
FIG. 4 is a cross-sectional view of a semiconductor device according to a third embodiment of this invention.

FIG. 4 shows a semiconductor device according to a third embodiment of this invention. In this embodiment, the second silicon nitride film 210b, which is formed in the second embodiment, is not provided and a hemispherical through-hole 215c formed in the second BPSG film 211 has an opening area set so as not to be extended to the second silicon oxide film 209. And, a cylindrical through-hole 215d is formed in the films formed under the second BPSG film 211 so as to communicate to the through-hole 215c and be extended to the surface of the n+ diffusion layer 205. Other structural aspects and the production method are the same as those of the second embodiment.

In the semiconductor device of this embodiment, the n+ diffusion layers 205 on the semiconductor substrate 201 are corresponded to a lower conductive layer, the first silicon oxide film 206, first silicon nitride film 210a and first BPSG film 207 are corresponded to a lower insulating layer, the first conductive layer 208 is corresponded to an intermediate conductive layer, the second silicon oxide film 209 and second BPSG film 211 are corresponded respectively to a first inter-layer insulating film and a second inter-layer insulating film and the second conductive film 213 is corresponded to an upper conductive layer.

In this embodiment, the insulating layers at and near the contact-hole are small in thickness and the aspect ratio of the cylindrical through-hole 215d is made smaller than that of the conventional one shown in FIG. 1, so that if the hemispherical through-hole 215c is not extended to the second silicon oxide film 209, the step coverage of the second conductive film 213 and a passivation film (not shown) can be more improved than that of the conventional one shown in FIG. 1.

In the above-mentioned embodiments, explanations were made on the contact-hole for connecting the n+ diffusion layers on the surface of semiconductor substrate and the second conductive film of Al-Si alloy (wiring layer), but not limited thereto, and as a result, this invention can be applied to any contact-hole, for example, for connecting the wiring layers with each other. In addition, the insulating films to be used are not limited to the combination of the above-mentioned silicon oxide film, silicon nitride film and BPSG film and as a result, other combinations may be used for this purpose.

What is claimed is:
1. A semiconductor device comprising:
   a lower conductive layer formed on a surface of or over a semiconductor substrate;
   a lower insulating layer formed on said lower conductive layer and having a first through-hole for wiring;
   an intermediate conductive layer formed on said lower insulating layer;
   a first inter-layer insulating layer formed on said intermediate conductive layer and having a second through-hole for wiring;
   a second inter-layer insulating layer formed on said first inter-layer insulating layer and having a third through-hole for wiring communicated to said second through-hole of said first inter-layer insulating layer;
   a third inter-layer insulating layer formed on said second inter-layer insulating layer and having a fourth through-hole communicated to and larger in opening area than said third through-hole of said second inter-layer insulating layer; and an upper conductive layer formed on said third inter-layer insulating layer and electrically connected through said first, second, third and fourth through-holes of said lower insulating layer, first inter-layer insulating layer, second inter-layer insulating layer and third inter-layer insulating layer to said lower conductive layer and not electrically connected to said intermediate conductive layer;

said second inter-layer insulating layer having a property which limits a removal action when said third inter-layer insulating layer is selectively removed by etching thereby to form said fourth through-hole;

wherein said upper conductive layer is in contact with an upper face of said first inter-layer insulating layer in said fourth through-hole of said third inter-layer insulating layer.

2. The semiconductor device as claimed in claim 1, wherein a thickness of said lower insulating layer in an area adjacent said first through-hole is made smaller than a thickness of said lower insulating layer in an area not adjacent said first through-hole.

3. The semiconductor device as claimed in claim 1, wherein said lower insulating layer includes an insulating layer sharing said property which limits a removal action as that of said second inter-layer insulating layer.

4. The semiconductor device as claimed in claim 1, wherein said fourth through-hole of said third inter-layer insulating layer is substantially hemispherical in shape and an open top of said through-hole of said third inter-layer insulating layer is larger in diameter than a bottom thereof.

5. The semiconductor device as claimed in claim 4, wherein said first and said second through-hole of each of said lower insulating layer and first inter-layer insulating layer is substantially cylindrical in shape.

6. The semiconductor device as claimed in claim 5, wherein said second inter-layer insulating layer is a silicon nitride film.

7. The semiconductor device as claimed in claim 1, wherein said third inter-layer insulating layer is a BPSG film.

8. A production method of a semiconductor device, comprising the steps of:
forming a lower conductive layer on a surface of or over a semiconductor substrate;
forming a lower insulating layer on said lower conductive layer;
forming an intermediate conductive layer on said lower insulating layer;
forming a first inter-layer insulating layer on said intermediate conductive layer;
forming a second inter-layer insulating layer on said first inter-layer insulating layer;
forming a third inter-layer insulating layer on said second inter-layer insulating layer;
selectively removing said third inter-layer insulating layer thereby forming a first through-hole for wiring extended to said second inter-layer insulating layer, said selective removal action in a direction perpendicular to said third inter-layer insulating layer being stopped by said second inter-layer insulating layer;
selectively removing said second inter-layer insulating layer, first inter-layer insulating layer and lower insulating layer thereby forming a second through-hole for wiring,
said second through-hole communicating said first through-hole and extending to said lower conductive layer, an opening area of said second through-hole being smaller in size than an opening area of a top of said first through-hole; and
forming an upper conductive layer for wiring on said third inter-layer insulating layer, which is electrically connected through said first and said second through-holes of said lower insulating layer, first inter-layer insulating layer, second inter-layer insulating layer and third inter-layer insulating layer to the said lower conductive layer, said upper conductive layer not being connected electrically to said intermediate conductive layer;
wherein said upper conductive layer is in contact with an upper face of said first inter-layer insulating layer in said first contact-hole of said third inter-layer insulating layer.

9. The production method as claimed in claim 8, wherein said step of forming a first through-hole for wiring in said third inter-layer insulating layer is achieved by an isotropic wet etching technique, and said step of forming said second through-hole for wiring in said second inter-layer insulating layer, first inter-layer insulating layer and lower insulating layer are achieved by an anisotropic dry etching technique.

10. The production method as claimed in claim 8, further comprising a step of selectively removing one part of said lower insulating layer in order to reduce a thickness of said lower insulating layer in the vicinity of a position where said through-hole is formed.

11. The production method as claimed in claim 10, wherein said lower insulating layer includes an insulating layer stopping said selective removal action in a direction perpendicular to said third inter-layer the same as said second inter-layer insulating layer.

12. The production method as claimed in claim 8, wherein a silicon nitride film is employed as said second inter-layer insulating layer.

13. The production method as claimed in claim 8, wherein a BPSG film is employed as said third inter-layer insulating layer.

14. A semiconductor device comprising:
a lower conductive layer formed on a surface of or over a semiconductor substrate;
at least one lower insulating layer formed on said lower conductive layer and having a first through-hole for wiring;
an intermediate conductive layer formed on said lower insulating layer;
a first inter-layer insulating layer and a second inter-layer insulating layer formed on said intermediate insulating layer and having a second through-hole for wiring communicated to the first through-hole for wiring of said lower conductive layer and not extended to the first inter-layer insulating layer; and
an upper conductive layer formed on said second inter-layer conductive layer, which is electrically connected through the first and second wiring through-holes of said lower insulating layer and inter-layer insulating layers to said lower conductive layer, said upper conductive layer not being electrically connected to said intermediate conductive layer;

wherein the thickness of said at least one lower insulating layer adjacent to said first wiring through-hole is formed is thinner than at positions not adjacent to said first wiring through-hole and said lower insulating layer includes a film having a removal action limiting property in the thickness direction when said lower insulating layer is selectively removed to reduce the thickness thereof.

15. The semiconductor device as claimed in claim 14, wherein said lower insulating layer having a removal action limiting property includes is a silicon nitride film.

16. The semiconductor device as claimed in claim 14, wherein said first and second inter-layer insulating layers are BPSG films.

17. The semiconductor device as claimed in claim 14, wherein said second through-hole of said first and second inter-layer insulating layers is substantially hemispherical in shape.

18. The semiconductor device as claimed in claim 14, wherein said first through-hole of lower insulating layers is substantially cylindrical in shape.

19. A production method of semiconductor device comprising the steps of:
   forming a lower conductive layer on a surface of or over a semiconductor substrate;
   forming at least one insulating layer on said lower conductive layer;
   selectively removing said at least one lower insulating layer thereby to form a layer area with a small thickness;
   forming an intermediate conductive layer on said at least one lower insulating layer said layer area with a small thickness;
   forming a first inter-layer insulating layer and a second inter-layer insulating layer on said intermediate conductive layer;
   selectively removing said second inter-layer insulating layer thereby to form a first through-hole for wiring, said first through-hole not extending to said first inter-layer insulating layer;
   selectively removing said first inter-layer insulating layer and lower insulating layer to form a second through-hole for wiring which is communicated to the first through-hole of said second inter-layer insulating layer and extended to said lower conductive layer, said second through-hole having an opening area smaller than said first through-hole of said second inter-layer insulating layer; and
   forming an upper conductive layer on said second inter-layer insulating layer, which is electrically connected through the first and second wiring through-holes of said lower insulating layer and inter-layer insulating layers, said upper conductive layer extending to said lower conductive layer and not being electrically connected to said intermediate conductive layer;
   wherein the step of selectively removing said lower insulating layer to form a layer area small in thickness utilizes an insulating film which is part of said at least one lower insulating layer and has a function of limiting removal of said lower insulating layer thereby to limit the removal action in the thickness direction thereof.

20. The production method as claimed in claim 19, wherein the step of forming a first wiring through-hole in said second inter-layer insulating layer is achieved by an isotropic wet etching technique and the step of forming the second wiring through-hole in said first inter-layer and lower insulating layers is achieved by an anisotropic dry etching technique.

21. The production method as claimed in claim 19, wherein said at least one lower insulating layer for restricting the removal of said lower insulating layer in the thickness direction thereof is a silicon nitride film.

22. The production method as claimed in claim 19, wherein said second inter-layer insulating layer is a BPSG film.

* * * * *